(12) United States Patent
Clarke

(10) Patent No.: US 6,562,141 B2
(45) Date of Patent: May 13, 2003

(54) DUAL DEGAS/COOL LOADLOCK CLUSTER TOOL

(76) Inventor: Andrew Peter Clarke, 5360 Queen Ann La., Santa Barbara, CA (US) 93111

( * ) Notice: Subject to any disclaimer, the term of this patent is extended or adjusted under 35 U.S.C. 154(b) by 95 days.

(21) Appl. No.: 09/798,048

(22) Filed: Mar. 5, 2001

(65) Prior Publication Data
US 2002/0000194 A1 Jan. 3, 2002

Related U.S. Application Data

(62) Division of application No. 09/609,733, filed on Jul. 3, 2000.

(51) Int. Cl.⁷ .......................... C23C 16/00; H05H 1/00; H01L 21/00
(52) U.S. Cl. .................. 118/719; 118/724; 118/725; 156/345.31; 156/345.32; 438/800
(58) Field of Search .................. 118/719, 723 MP, 118/733, 724, 725, 728, 729, 620, 641; 156/345.31, 345.32; 438/800, 707, 708

(56) References Cited

U.S. PATENT DOCUMENTS

| | | | |
|---|---|---|---|
| 4,504,194 A | 3/1985 | Holden | 417/48 |
| 5,002,464 A | 3/1991 | Lee | 417/152 |
| 5,259,881 A | 11/1993 | Edwards et al. | 118/719 |
| 5,380,682 A | 1/1995 | Edwards et al. | 437/225 |
| 5,512,320 A * | 4/1996 | Turner et al. | 427/255 |
| 5,516,732 A | 5/1996 | Flegal | 437/250 |
| 5,520,002 A | 5/1996 | Ishikawa | 62/55.5 |
| 5,592,581 A * | 1/1997 | Okase | 392/418 |
| 5,613,821 A | 3/1997 | Muka et al. | 414/217 |
| 5,730,801 A | 3/1998 | Tepman et al. | 118/719 |
| 5,770,515 A | 6/1998 | Meng et al. | 438/592 |
| 5,799,860 A | 9/1998 | Demaray et al. | 228/194 |
| 5,830,277 A * | 11/1998 | Johnsgard et al. | 118/725 |
| 5,855,675 A | 1/1999 | Doering et al. | 118/719 |
| 5,902,088 A | 5/1999 | Fairbairn et al. | 414/217 |
| 5,909,994 A | 6/1999 | Blum et al. | 414/217 |
| 5,911,834 A | 6/1999 | Fairbairn et al. | 134/1.3 |
| 5,928,389 A | 7/1999 | Jevtic | 29/25.01 |
| 5,944,857 A | 8/1999 | Edwards et al. | 29/25.01 |
| 6,121,579 A * | 9/2000 | Aoki et al. | 219/390 |
| 6,228,173 B1 * | 5/2001 | Okase et al. | 118/719 |

OTHER PUBLICATIONS

IBM Technical Disclosure Bulletin 118–48 entitled "Two--Chamber Air–To–Vacuum Lock System" by G.F. Barber, Dec. 1968, pp. 757–758.

\* cited by examiner

Primary Examiner—Gregory Mills
Assistant Examiner—P. Hassanzadeh
(74) Attorney, Agent, or Firm—Arthur K. Samora; Kenneth J. Hovet

(57) ABSTRACT

A cluster tool includes a block which is formed with an inner high vacuum chamber, at least two loadlock chambers that are in fluid communication with the high vacuum chamber, and at least two slot valves for selectively isolating each loadlock chamber from the high vacuum chamber. The cluster tool also includes a high vacuum pump that is connected to the high vacuum chamber and a water pump comprising a refrigeration unit and a cryoplate. The cryoplate is cooled by the refrigeration unit and projects into the high vacuum chamber between the loadlock chambers. Selective operation of the slot valves allows a single water pump to serve a plurality of loadlock chambers. Each loadlock chamber includes a refrigerated platen that projects into the loadlock chamber, a heat lamp assembly that radiates into the loadlock chamber, and a tray for holding the wafer therein. The platen has a cooling system for selectively cooling the wafer, and selective radiation of the heat lamp assembly degasses the wafer. Accordingly, the loadlock chamber performs both wafer degassing and wafer cooling functions simultaneously to decrease processing time for the wafer and to eliminate the need for a dedicated degassing chamber and cooling chamber in the cluster tool.

10 Claims, 5 Drawing Sheets

US 6,562,141 B2

DUAL DEGAS/COOL LOADLOCK CLUSTER TOOL

This is a division of application Ser. No. 09/609,733 filed Jul. 03, 2000.

FIELD OF THE INVENTION

The present invention pertains generally to cluster tools and processes which use a cluster tool. More particularly, the present invention pertains to cluster tools used in various processes for applying a coating to a silicon wafer. The invention is particularly, but not exclusively, useful as a cluster tool which simultaneously removes water vapor from a chamber containing a wafer while establishing a vacuum on the chamber to shorten the coating process and maximize wafer movement through the cluster tool.

BACKGROUND OF THE INVENTION

In order to more fully appreciate the cluster tool of the present invention, some discussion of the scientific principles behind a vacuum deposition process is helpful. In general, if two electrodes and the gas therebetween are at extreme low pressure, less than $\frac{1}{10,000}$ of atmospheric pressure, the resistance of the gas will break down and allow current flow between the two electrodes. This is called a "glow discharge" in the prior art.

Importantly, during the glow discharge process, the ionized gas atoms become attracted to and collide with the negative electrode (cathode), while the free electrons become attracted to and move towards the positive electrode (anode). Since electron mass is generally negligible relative to an atom, the electrons do not substantially affect the anode during collision. The mass of the ionized gas atoms, however, may be substantial relative to the mass of the atoms for the cathode material. Accordingly, when the ionized gas atoms collide with the cathode, the force of collision causes cathode material to be emitted. This phenomena is known as sputtering, or the removal of material from the cathode by ion bombardment during a glow discharge.

The material that sputters from the cathode coats the surrounding surfaces. If a sputtering device is designed in a certain manner, a uniform, quality coating of the sputtered material can be deposited onto a substrate. The deposition of sputter material to form such a coating is often referred to as a vacuum deposition process.

In the semiconductor industry, the vacuum process is used to coat silicon wafers, and certain devices that accomplish this result are known in the industry as cluster tools. To accomplish the vacuum process, however, the silicon wafer must be processed within a cluster tool capable of maintaining an extreme vacuum condition to ensure film purity. In addition to the vacuum issue, all water vapor molecules must be removed from the wafer to prevent contamination of the vacuum processes within the cluster tool, as water vapor is an undesirable process component that affects the quality of the finished wafer. Finally, outgoing wafers may be hot after undergoing a plurality of vacuum processes, and it is desirable to cool the wafers within the cluster tool, to reduce the risk of oxidation or corrosion.

Cluster tools typically consist of a loadlock chamber for receiving wafers and a plurality of vacuum processing chambers for processing the wafers. In a conventional cluster tool, the wafers are introduced to the loadlock in a 25-wafer cassette module. Typically, the entire cassette module of wafers is placed in the loadlock chamber, and the loadlock chamber (along with the cassette module) is pumped down to high vacuum. This is a time consuming process. If the volume in the loadlock vacuum chamber could be minimized, and the vacuum condition established is merely a "rough" vacuum sufficient for further processing of the wafer within the cluster tool, the time required to establish a vacuum on the loadlock chamber will be reduced. Thus, the efficiency of the cluster tool would be increased.

Prior art cluster tools typically have a dedicated degassing chamber for degassing the wafer, or removing the entrained water vapor molecules from the wafer. In the prior art, once the cassette module is under "rough" to mid-range vacuum conditions ($10^{-2}$ torr to $10^{-3}$ torr, where 760 torr=1 Atm= atmospheric pressure), the wafers are successively placed in the dedicated degassing chamber for individual degassing prior to undergoing several vacuum processes. The dedicated degassing chamber is usually within the high vacuum body of the prior art cluster tool. What is desired is a cluster tool that degasses the wafers in the loadlock chamber under rough vacuum conditions. This eliminates the need for a dedicated processing position within the high vacuum body of the cluster tool.

Degassed water vapor is removed from the high vacuum body of the cluster tool by cryopumps. A cryopump typically consists of a refrigeration unit that maintains an extremely low temperature on an array of metallic plates. The array is positioned in communication with the chamber and the water vapor molecules therein, and the water molecules impinge on the plate and are frozen thereto. These cryopumps are expensive and difficult to maintain. What is desired is a cluster tool that eliminates the need for a dedicated cryopump for each degassing chamber. One way to eliminate a dedicated cryopump is to remove water vapor molecules from the wafer while the wafer is at rough vacuum in the loadlock chamber. This will reduce the amount of residual water vapor in the proximity of the high vacuum body of the cluster. If this can be accomplished, vacuum quality and vacuum process quality can be enhanced. Also, the required number of cryopumps for the cluster tool would decrease, which further decreases the maintenance requirements for the cluster tool and increases the overall reliability of the tool.

In the prior art, once each wafer from the cassette module has been degassed, the wafer is successively placed in a plurality of vacuum processing chambers and undergoes a plurality of vacuum processes. After completion of the processes, the wafer may be placed in a dedicated chamber for cooling. The wafer is then placed back into the cassette module, and another wafer is selected from the cassette to begin the processes discussed above. When all of the wafers in the cassette module have finished processing, the entire cassette module is removed from the loadlock chamber.

With the above configuration, however, the first wafer spends more time cooling after its process is completed than the final wafer. Conversely, the last wafer to be processed has spent more time "drying" under vacuum before undergoing its vacuum processes. This can lead to a drift in measurable process quality in the wafers being loaded one at a time from the cassette module into the cluster tool for processing. This is known in the prior art as the "first wafer effect". What is desired is a cluster tool with loadlock chambers that are capable of performing both degas and cooling functions during processing of the wafer, to standardize the amount of time each wafer spends at each step of the process and, thereby, to improve the consistency of the finished wafer quality.

U.S. Pat. No. 5,516,732, which issued to Flegal for an invention entitled "Wafer Processing Machine Vacuum Front End Method and Apparatus", discloses a station in which a preheating and degassing function are combined. Flegal, however, does not disclose a water pump positioned in fluid communication with the chamber for removal of the water vapor molecules at extreme vacuum. This is because the device, as disclosed by Flegal, is known as a "front end device" and must be connected to a cluster tool to perform a vacuum process. Accordingly, Flegal does not minimize the "water load" on the processing stations and does not minimize the number of cryopumps required to operate the cluster tool.

U.S. Pat. No. 5,902,088, which issued to Fairbaim et al for an invention entitled "Single Loadlock Chamber With Wafer Cooling Function", discloses a device in which a plurality of trays for receiving wafers are mounted within a loadlock structure, with the loadlock structure also performing a cooling function. The loadlock structure disclosed by Fairbaim, however, is sized to hold twelve to fourteen wafers, and establishing a vacuum on this size of a loadlock chamber presents the same problems that the present invention overcomes. Further, like Flegal, Fairbaim does not disclose a water pump attached in fluid communication with the loadlock structure and also does not minimize the number of water pumps required for the overall cluster tool.

In view of the above, it is an object of the present invention to provide a cluster tool that increases throughput of silicon wafers by performing the degassing of the wafer simultaneously with establishing a vacuum for the loadlock chamber containing the wafer. This decreases the overall processing time and increases wafer throughput.

It is another object of the present invention to provide a cluster tool that performs the degassing and the cooling steps within the loadlock chamber, to eliminate the need for separate dedicated degassing and cooling chambers. It is another object of the present invention to provide a cluster tool with a loadlock chamber that is sized to process a single wafer at a time, thereby minimizing the required volume to be placed under vacuum and eliminating what is known as "the first wafer effect".

It is another object of the present invention to provide a cluster tool with a single high vacuum chamber which services two loadlocks. This configuration minimizes the number of cryopumps required for the cluster tool and maximizes the reliability of the cluster tool.

Each of the above features and objectives results in a cluster tool that is easier to operate and is more reliable. It is also simpler to manufacture at less cost.

SUMMARY OF THE INVENTION

A cluster tool for performing a vacuum process on a silicon wafer in accordance with the present invention includes at least two loadlock chambers and a high vacuum chamber that are provided within a metal block. The loadlock chamber extend completely through the block from the block top surface to the block bottom surface. The high vacuum chamber is in fluid communication with each loadlock chamber in the block. An isolation means for selectively isolating each loadlock chamber from the high vacuum chamber, preferably a slot valve, is placed in each respective path of fluid communication. A respective roughing pump is connected in fluid communication with each loadlock chamber for establishing an initial vacuum therein.

The cluster tool of the present invention further includes a high vacuum pump and a water pump. The high vacuum pump is mounted to the block in fluid communication with the high vacuum chamber. The water pump comprises a refrigeration unit and a cryoplate. The refrigeration unit is mounted to the block, while the cryoplate is attached in thermal communication with the refrigeration unit. More specifically, the cryoplate projects from the refrigeration unit through the block and into the high vacuum chamber.

The cryoplate is positioned within the high vacuum chamber so that it is between the loadlock chambers and is directly in front of each respective slot valve. When a loadlock chamber is placed in fluid communication with the high vacuum chamber, the high vacuum pump draws water vapor molecules from the loadlock chamber. The water vapor molecules impinge upon the cryoplate and freeze thereon. The orientation of the high vacuum pump and water pump between the loadlock chamber minimizes the number of water pumps and high vacuum pumps needed to establish and maintain a high vacuum on the loadlock chambers.

The loadlock chambers are sized and shaped to accommodate a single wafer in order to minimize the required volume which is to be pumped to high vacuum. Each loadlock chamber has a top wall, a bottom wall and side walls and includes a platen comprising a stem that merges into a bell portion, with the bell portion terminating at a flat bottom surface. The platen stem is slidingly positioned within an opening in the top wall and projects downwardly into the loadlock chamber so that the bell portion is completely within the loadlock chamber.

The loadlock chamber of the present invention also includes a holding means that is adapted to hold a silicon wafer, and a plurality of heat lamps. The holding means comprises a tray with a plurality of rails that extend downwardly from the top wall in a surrounding relationship with the bell portion of the platen. Each rail has an upper flange and a lower flange that project perpendicularly from the rail, thereby establishing an inverted F-shape for the rail. When the wafer is resting on the upper flanges, the wafer is immediately proximate the bell portion bottom surface. When the wafer is resting upon the lower flanges, the wafer is spaced-apart from the platen bottom surface.

The loadlock chamber of the present invention further includes a plurality of heat lamps that are mounted to the bottom wall of the loadlock chamber so that they illuminate upwardly into the loadlock chamber. When the wafer is resting on the lower flanges, the wafer is coextensive with a focal plane of uniform radiation intensity from the heat lamps. The heat lamps, tray and platen combine to establish a loadlock chamber which can perform both a cooling and a degassing function, thereby reducing the number of loadlock chambers required for the cluster tool.

For the method of the present invention, the wafer is placed in the loadlock chamber on the lower flanges, and an initial vacuum is established by the corresponding roughing pump. Simultaneously, the heat lamps are activated to radiate heat energy to the wafer, thereby causing the release of water vapor molecules from the wafer, thereby degassing the wafer. Next, the roughing pump is isolated from the loadlock chamber, the lamps are preferably turned off, and the loadlock chamber is aligned in fluid communication with the high vacuum chamber by opening the corresponding slot valve. A high vacuum pump produces a high vacuum in the high vacuum chamber and draws residual water vapor molecules from the loadlock chamber into the high vacuum chamber.

As the molecules are drawn into the high vacuum chamber, the molecules impinge on the cryoplate, as discussed above, and are frozen onto the cryoplate. In this manner, the silicon wafer undergoes an initial degassing and a high vacuum is quickly and easily established in the loadlock chamber. Thereafter, the wafer undergoes a plurality of manufacturing processes in a manner known in the art.

BRIEF DESCRIPTION OF THE DRAWINGS

The novel features of this invention will be best understood from the accompanying drawings, taken in conjunction with the accompanying description, in which similar characters refer to similar parts, and in which.

WRITTEN DESCRIPTION OF THE PREFERRED EMBODIMENT

Figure 1:
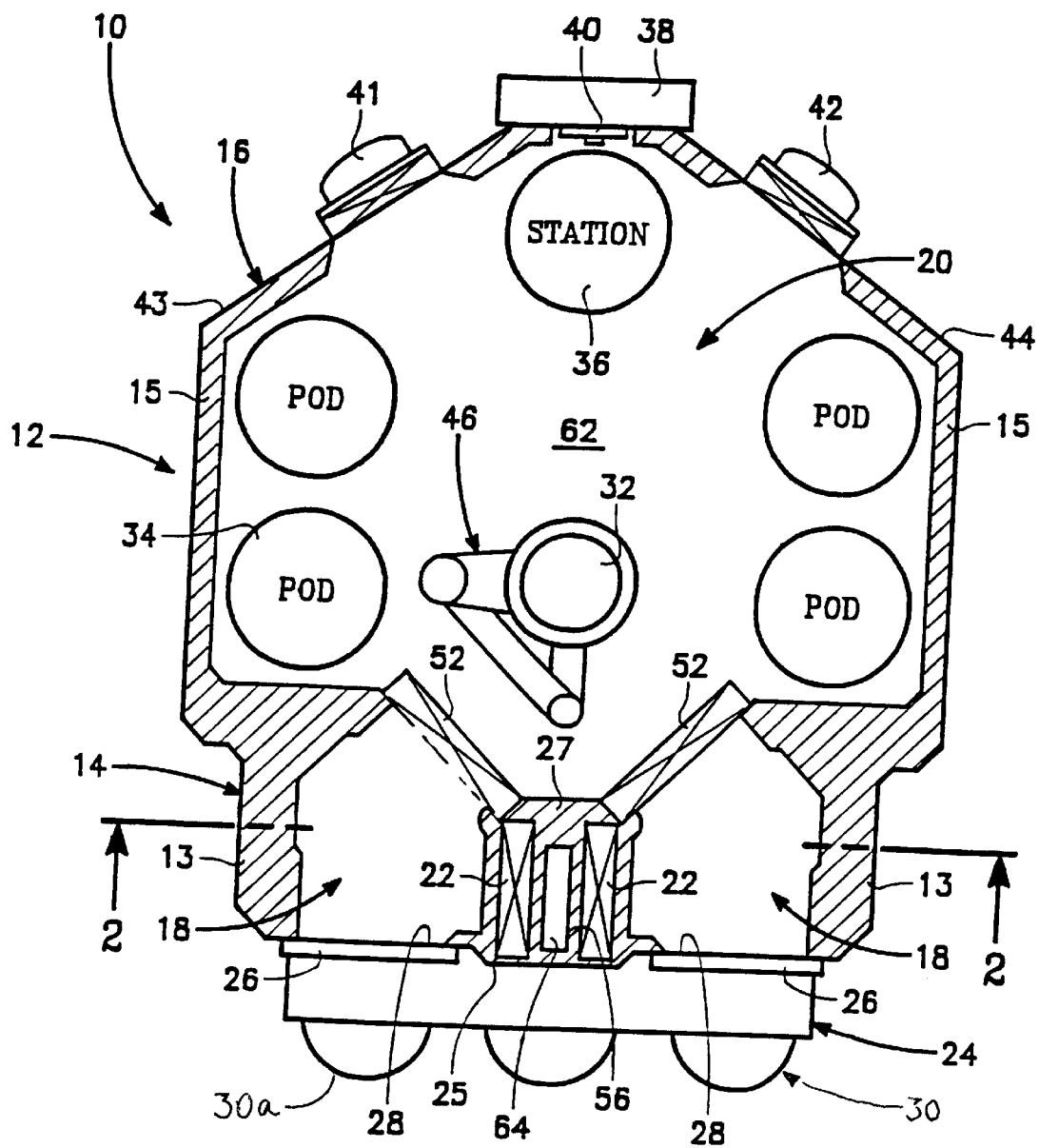
FIG. 1 is a top plan view of the cluster tool of the present invention with a large portion of the top wall of the tool removed for clarity.
Figure 2:
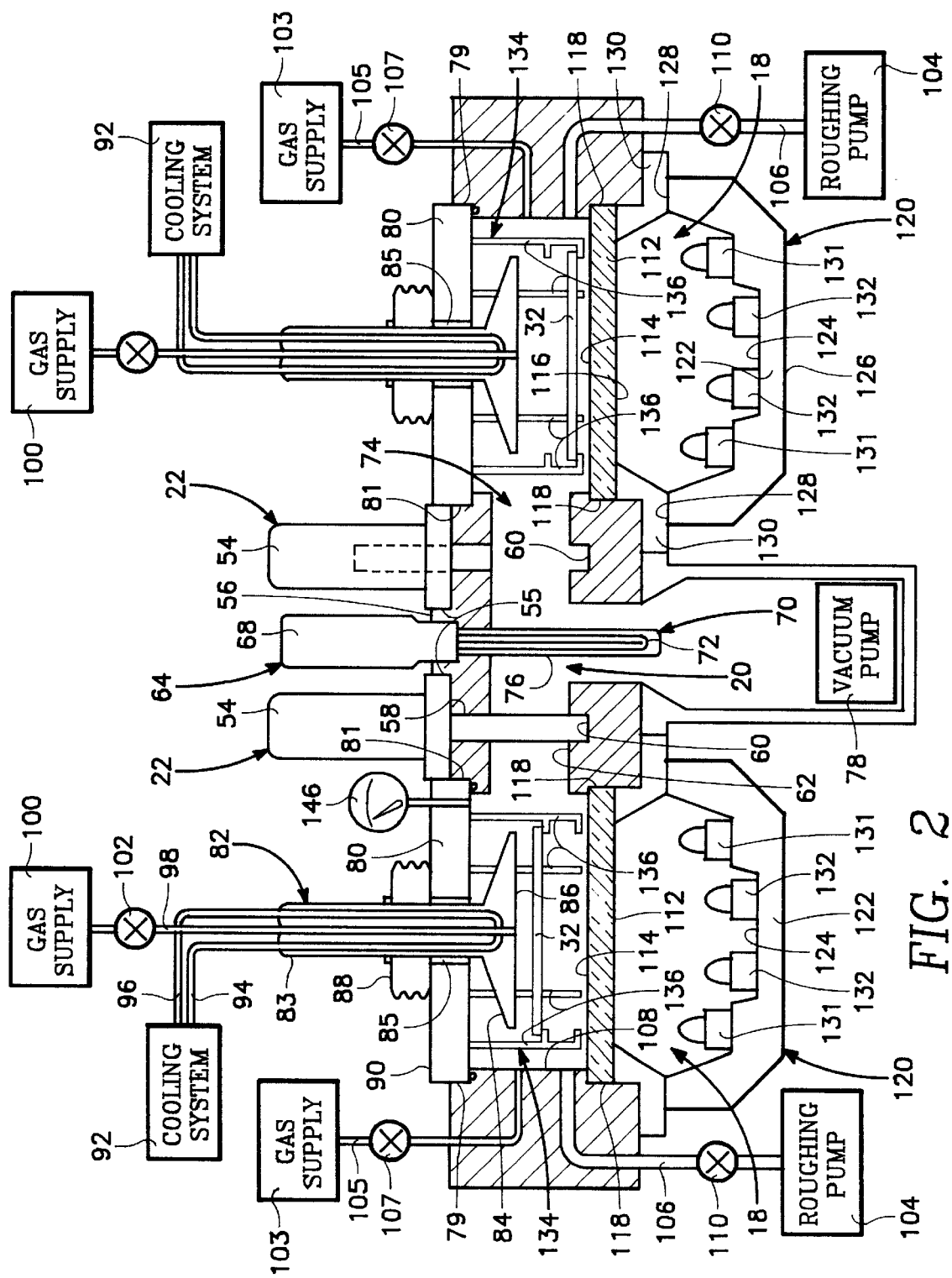
FIG. 2 is a cross-sectional view of the front portion of FIG. 1 as seen along lines 2—2 in FIG. 1.

With reference now to FIGS. 1 and 2, the cluster tool of the present invention is shown and generally designated by reference character 10. As shown, the structural framework for a cluster tool comprises a block 12 which includes a front portion 14 and a rear portion 16. The front portion includes a front wall 25 and a valve retaining wall 27 behind the front wall and is oriented somewhat parallel thereto. A pair of symmetrically opposed front portion side walls 13, 13 respectively merge into similarly opposed rear portion side walls 15, 15. The rear portion side walls further merge rearwardly into a first diagonal wall 43 and a second diagonal wall 44. The first and second diagonal walls merge into rear portion rear wall 40, as shown in FIG. 1. The front portion side walls, rear portion side walls, first and second diagonal walls and rear portion rear wall all project about perpendicularly from bottom wall 62.

The front portion of the block includes two loadlock chambers 18, 18. As best seen in FIG. 2, the front portion further includes a high vacuum chamber 20 that is in communication with each respective loadlock chamber. Each loadlock chamber is selectively isolated from the high vacuum chamber with a slot valve 22, 22 that is attached to top wall 56, front wall 25 and valve retaining wall 27 in a manner hereinafter more fully described. By referring to both FIGS. 1 and 2, it can be seen that the cluster tool includes a pair of top cover plates 80, 80, with each top cover plate being attached to a respective front portion wall notch 79 and top wall notch 81.

In the preferred embodiment, the block is made from an aluminum alloy. However, other types of machinable and/or castable metal alloys may be used without departing from the scope of the present invention.

A front loader 24 is attached to front wall 25 of the block. The front loader includes a pair of bay doors 26, 26 that correspond to front openings 28, 28 in the front wall. The front openings provide an access through the front wall to the loadlock chambers. A plurality of cassette modules, of which module 30a is representative, are attached to the front loader. These may be open wafer cassettes, SMIF (Standard Mechanical Interface Format) devices, FOUP's (Front Opening Universal Pods) or other structures known in the art for holding wafers. The front loader has internal structure (not shown), typically a front loader robot, for selectively transferring silicon wafers 32 from the cassette module through the bay doors to the loadlock chambers in a manner known in the prior art. An exemplary front loader of the type discussed is manufactured by Asyst® or Brooks Automation®.

In rear portion 16, a plurality of processing pods 34 are attached to the bottom wall of the block for accomplishing a sequence of vacuum processes on silicon wafer 32. The rear portion also includes an etching station 36, which is electrically connected to a radio frequency (RF) matching unit/power supply 38 that is mounted on rear wall 40 of the block.

First rear cryopump 41 is attached to rear diagonal wall 43, and second rear cryopump 42 is attached to rear diagonal wall 44 of the block in communication with rear portion chamber 19, as shown in FIG. 1. The first and second rear cryopumps remove water vapor and gas molecules and establish a high vacuum in rear portion chamber 19 in a manner known in the prior art.

As further seen in FIG. 1, a rear robot 46 is centrally placed within the rear portion and attached to bottom wall 62. The rear robot selectively accesses the loadlock chambers through loadlock access valves 52, 52 that are attached to valve retaining wall 27 and front portion side walls 13, 13. The rear robot selectively transfers the wafer between loadlock chambers in the front portion of the cluster tool and the various processing pods in the rear portion chamber. The rear robot further transfers wafers between the vacuum process pods and the etching station, according to a predetermined algorithm that is programmed by a user (not shown) according to design requirements for the finished wafer.

Referring now to FIGS. 2–5, the front portion of the block is shown with the high vacuum chamber 20 transversely centered within the front portion. As stated above, the high vacuum chamber is between the loadlock chambers and also is in communication with each loadlock chamber.

As also stated above, a slot valve is mounted between each loadlock chamber and the high vacuum chamber for selectively isolating each loadlock chamber from the high vacuum chamber. Each slot valve includes a valve body 54 which is mounted within a recess 55, 55 of top wall 56 of the block.

The valve body includes a valve stem 58 which is slidingly disposed within the valve body and has an extended position wherein the valve stem protrudes downwardly through the block into the high vacuum chamber. Valve stem 58 further has a retracted position wherein the valve stem is substantially encased by the valve body.

For each slot valve, a valve seat 60 is machined into the inner surface of bottom wall 62 of the block opposite from the valve stem. As best seen in FIGS. 2–5, when the valve stem 58 is in the retracted position within the valve body, a path of communication will exist between the corresponding loadlock chamber to the high vacuum chamber. When the valve stem is in the extended position, the valve stem will be seated in valve seat 60, and the corresponding loadlock chamber will be isolated from the high vacuum chamber.

A water pump 64 which includes a refrigeration unit 68 and a cryoplate 70 is attached to top wall 56 of the block. The refrigeration unit extends upwardly therefrom. The cryoplate is in thermal communication with the refrigeration unit and extends downwardly therefrom through the top wall and into the high vacuum chamber.

The refrigeration unit includes a cryoplate cooling line 72 which extends from the refrigeration unit and is routed internally within the cryoplate. The cryoplate cooling line circulates coolant (not shown) from the refrigeration unit through the cryoplate and back to the refrigeration unit, for maintaining a desired temperature on the cryoplate surface. In the preferred embodiment, the cryoplate is maintained at a temperature of approximately one hundred degrees Kelvin (T=100° K.). It is to be appreciated that other configurations for the heat exchanger and cryoplate are envisioned, provided the cryoplate can maintain the desired low temperatures.

A flat face 76 of the cryoplate is directly in front of the slot valve opening 74 of each loadlock chamber, for reasons to be described. With this configuration, a single water pump can serve a plurality of loadlock chambers.

A high vacuum pump 78 (depicted in schematic in FIGS. 2–5) is attached in communication with the high vacuum chamber for establishing a high vacuum therein in a manner known in the art. Once the corresponding slot valve is open, the loadlock chamber will be in communication with high vacuum chamber 20, and a high vacuum will also be established in the corresponding loadlock chamber. In a preferred embodiment, the high vacuum pump is a magnetic-levitation-bearing turbopump for producing a vacuum in the range of $10^{-4}$ to $10^{-8}$ torr. An exemplary type of pump is manufactured by Varian®.

With further reference to FIGS. 2–5, the loadlock chamber of the present invention also includes a platen 82. The platen comprises a platen stem 83 that merges into a lower bell portion 84. The platen stem is oriented vertically and is slidingly disposed within an opening 85 in the top cover plate. With the platen stem oriented in this manner, the bell portion of the platen will be located within the loadlock chamber, and bell portion bottom surface 86 will be oriented horizontally within the loadlock chamber.

To maintain a predetermined platen temperature, a platen cooling system 92 is connected to the platen stem. Specifically, a platen cooling supply line 94 is attached to the platen cooling system. The supply line extends internally within the platen stem and merges into a platen cooling return line 96. The platen cooling return line 96 is also internally located within the platen stem and exits therefrom to connect with the platen cooling system. With this configuration, refrigerant (not shown) is circulated from the platen cooling system internally through the platen stem and back to the platen cooling system for cooling the platen.

A platen gas supply line 98 also is mounted internally within the platen stem. The platen gas supply line extends from a platen gas supply 100 and terminates at the bottom surface of the platen. A platen gas line flow-controlling valve 102 is attached to the platen gas line to selectively isolate the loadlock chamber from the platen gas supply and to control the flow of gas therefrom. This configuration allows a path of fluid communication to be selectively established between the platen gas supply and the loadlock chamber, for cooling a wafer as described below.

A bellows 88 is mounted to the top cover plate outer surface 90, and the bellows is further attached in a surrounding relationship to the platen stem 83. The bellows allows for a sliding up-and-down movement of the platen, while at the same time maintaining vacuum integrity within the loadlock chamber.

Each loadlock chamber includes a chamber gas supply 103 for venting the loadlock chamber. A chamber gas supply line 105 is attached to the chamber gas supply and terminates at the inner wall 108 of the loadlock chamber to provide a path of fluid communication between the chamber gas supply and the loadlock chamber. A vent valve 107 in the chamber gas supply line 105 selectively isolates the chamber gas supply from the loadlock chamber.

In the preferred embodiment, a gas, such as Argon or Nitrogen, is used as the working gas for the platen gas supply, as well as the chamber gas supply. It is to be appreciated, however, that other gases could be used for performing the cooling function of the platen gas supply and the venting function of the chamber gas supply, as described above.

With reference to FIG. 2, each loadlock chamber includes a respective roughing pump 104 for establishing an initial "rough" (approximately $10^{-2}$ to $10^{-3}$ torr) vacuum on the loadlock chamber. The roughing pump is connected in fluid communication with the loadlock chamber via a roughing pump line 106 which extends through the front portion side wall and terminates at inner surface 108 of the front portion side wall. A roughing pump valve 110 is placed in the roughing pump line to selectively isolate the roughing pump from the loadlock chamber.

Each loadlock chamber has a dedicated roughing pump. It is to be appreciated, however, that two loadlock chambers are never pumped to rough vacuum conditions at the same time, as hereinafter discussed in the Operation section of this specification. Accordingly, roughing pump line 106 could be routed to a plurality of loadlock chambers so that only one roughing pump can be used for a plurality of loadlock chambers.

A bottom cover plate 112 is attached to the bottom wall 62 of the block at a pair of opposing bottom wall niches 118. The bottom cover plate has an underside 114 and a top side 116 and is attached to the bottom wall niches with the top side facing into the loadlock chamber. Below the bottom cover plate, a heat lamp assembly 120 is attached to the block.

The heat lamp assembly comprises a somewhat U-shaped reflector 122 with an upper reflector surface 124 and a lower encasement surface 126, as well as a pair of opposing mounting surfaces 128, 128 at the upwardly facing peripheral ends of the U-shaped reflector. A mounting bracket 130 is attached to each respective mounting surface as shown in FIGS. 2–5. The mounting brackets are secured to the bottom wall and the underside 116 of the bottom cover plate.

An upper plurality of heat lamps 131 and a lower plurality of heat lamps 132 are attached to the upper reflector surface 124 and radiate heat energy toward the bottom cover plate. The upper and lower pluralities of heat lamps are arranged in concentric circles, with the upper plurality circle being outside the lower plurality circle. The lamp intensity, distance between each lamp, and distance between each lamp and the bottom cover plate are adjusted to establish a plane of uniform radiation intensity within the loadlock chamber during illumination. The bottom cover plate is made of a material, such as quartz, which allows free passage of the heat lamp radiation into the loadlock chamber.

The cluster tool of the present invention further includes a tray 134 which is attached to the top cover plate for accurately positioning the wafer within the loadlock chamber. The tray comprises a plurality of rails 136, 136, that are mounted to the top cover plate so that they extend vertically downward therefrom in a surrounding relationship with the bell portion 84. Each rail has an upper flange 138 and a lower flange 140 that project substantially perpendicularly from the rail, so that each rail has an inverted F-shape. The inverted F-shape establishes an upper flange horizontal surface 142 and a lower flange horizontal surface 144 for each rail.

The tray rails 136 extend downwardly into the loadlock chamber so that the upper flanges 138 of the trays are directly below the bell portion bottom surface 86. The lower flanges 140 are located directly above topside 114 of bottom cover plate 112. When a wafer is positioned at rest on the upper flange horizontal surfaces 142, the wafer will be immediately proximate bell portion bottom surface 86. When the wafer 32 is positioned at rest on the lower flange horizontal surfaces 144, the wafer will be immediately above the bottom cover plate. The flanges align the wafer so that it will be coextensive with the plane of uniform radiation intensity from the heat lamps discussed above. Accordingly, the wafer will be heated (and subsequently degassed) in a uniform manner.

OPERATION

Figure 3:
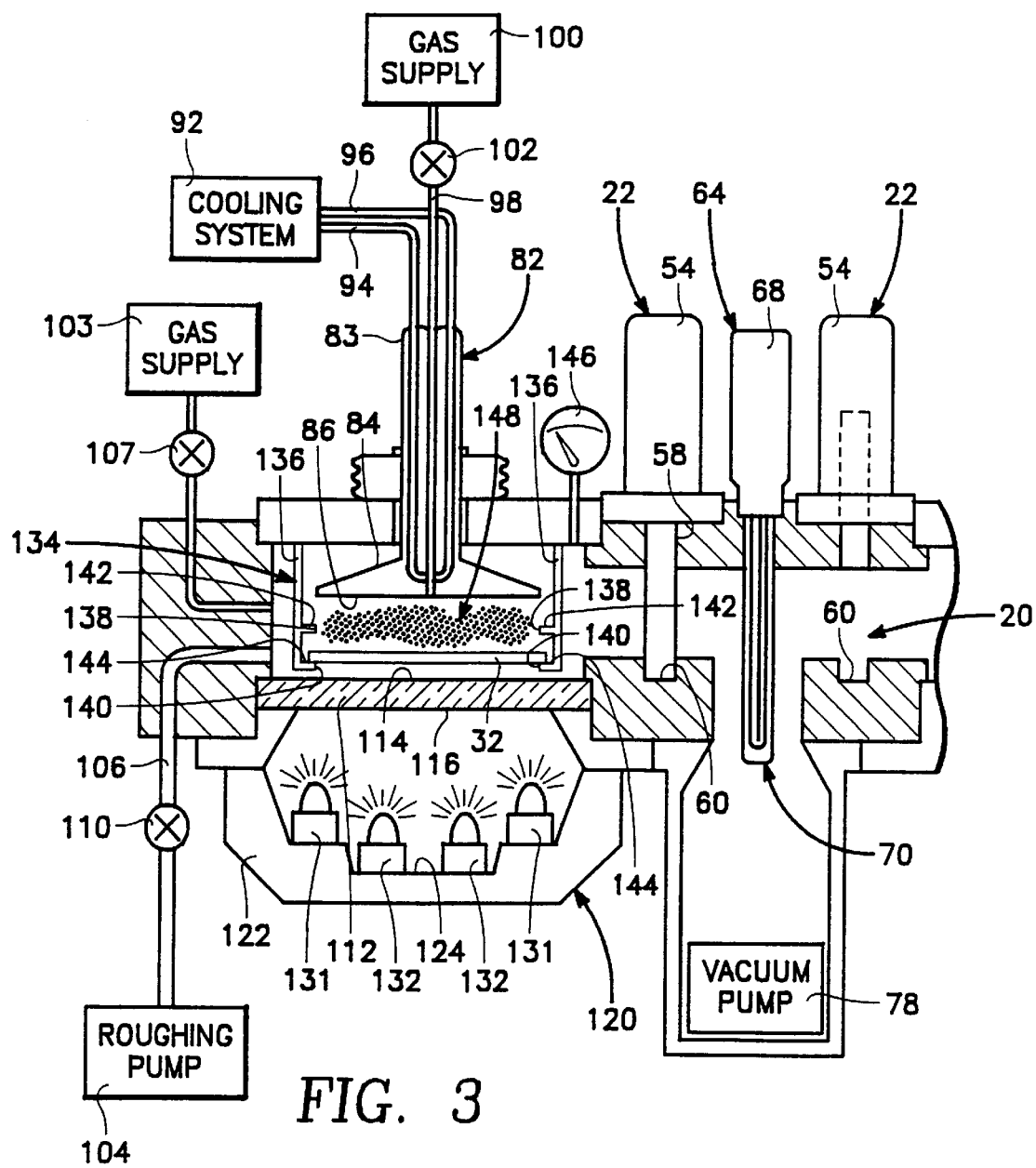
FIG. 3 is a cross-sectional view of a single loadlock chamber and the high vacuum chamber of the front portion of FIG. 2 during a degassing operation.

To operate the cluster tool, front loader 24 transfers wafer 32 from a cassette module 30, (SMIF device or FOUP) to one of the loadlock chambers 18, 18 for processing. Initially, the wafer is placed on tray 134 within the loadlock chamber so that it rests on the lower flange horizontal surfaces 144, as shown in FIG. 3. The associated slot valve 22 for the loadlock chamber is closed, and the roughing pump 104 is stopped. Next, the roughing pump valve 110 is opened and the roughing pump is actuated to establish an initial vacuum, preferably on the order of $10^{31\ 2}$ to $10^{-3}$ torr as indicated by a chamber vacuum gage 146.

As the roughing pump establishes an initial vacuum in the loadlock chamber, the wafer is simultaneously degassed by the heat lamp assembly 120. To do this, the upper plurality and lower plurality of lamps are activated and direct heat energy through the bottom cover plate to the wafer. As the wafer is heated, entrained water molecules 148 in the wafer are released into the loadlock chamber whereby the wafer becomes degassed. The degassing of the wafer is accomplished simultaneously with the establishment of an initial rough vacuum on the loadlock chamber, to decrease overall processing time and increase the capacity of the cluster tool.

Once the initial vacuum is established on the loadlock chamber, the roughing pump valve is closed and the roughing pump is stopped. The adjacent high vacuum chamber 20 is placed in communication with the loadlock chamber that contains the wafer by opening a corresponding slot valve 22.

Figure 4:
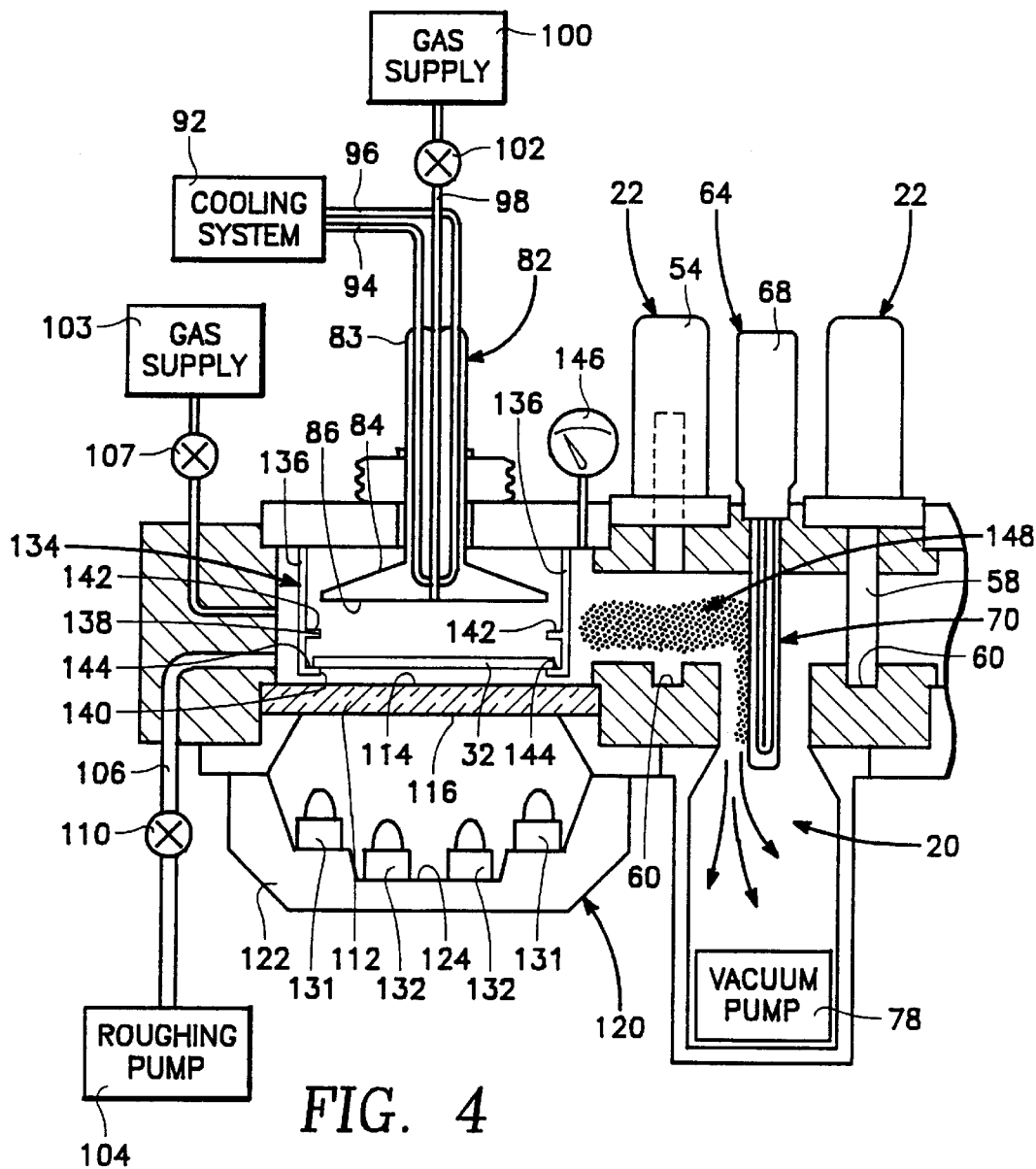
FIG. 4 is the same view as FIG. 3 with the slot valve open and the high vacuum pump operating.
Figure 5:
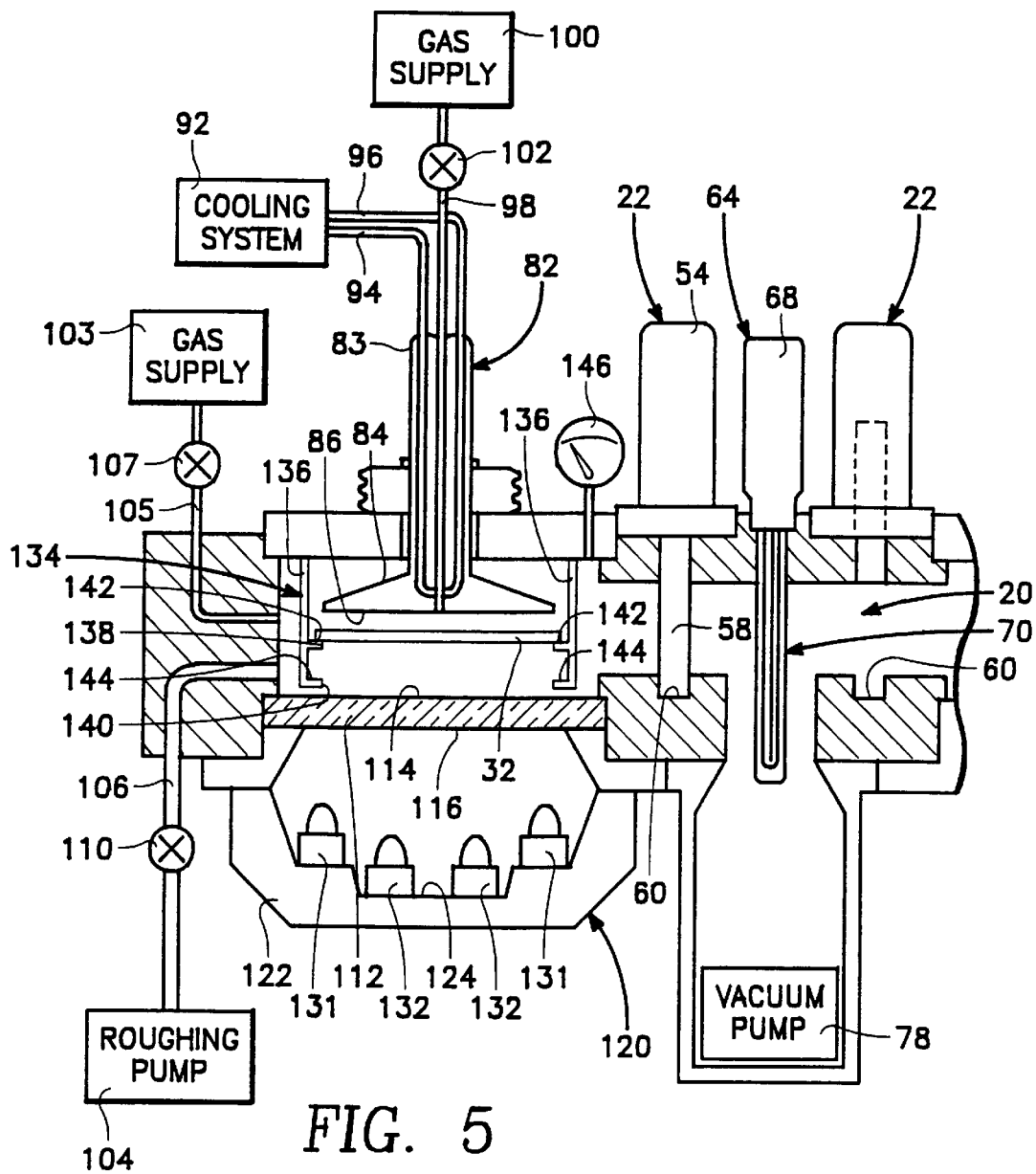
FIG. 5 is the same view as FIG. 3 during a cooling operation.

Referring to FIG. 4, as the slot valve opens, the high vacuum pump (which preferably operates continuously) draws remaining gas and water vapor molecules from the loadlock chamber through the slot valve opening. As the water molecules are drawn into the high vacuum chamber from the slot valve opening, they impinge directly onto the cryoplate face 76 of the water pump (which may also operates continuously), which is directly in front of the slot valve opening 74. As the water molecules contact the cryoplate, they freeze thereon because the cryoplate is maintained at a temperature at, or below, their freezing point at high vacuum conditions. The removal of water vapor molecules from the wafer while the wafer is still in the loadlock chamber reduces the "water load" for the cryopumps 41, 42 in the rear portion of the block and is one of the operative aspects of the invention.

After the wafer has been processed in the loadlock chamber as described above, the loadlock access valve 52 opens and the rear robot 46 transfers the wafer from the loadlock chamber to the vacuum processing pod(s) in the rear portion 16 of the block. As discussed above, the first and second rear cryopumps have established a high vacuum in the rear portion. Since the rear portion is under high vacuum conditions similar to that of the loadlock chamber, the wafer remains under a high vacuum as it is transferred from the loadlock chamber to the rear portion. The wafer may then be transferred to all or part of the processing pods according to a predetermined algorithm that is based on design requirements for the finished wafer.

After the wafer has undergone the last manufacturing procedure, the rear robot places the processed wafer from the vacuum processing station on upper flange surfaces 142 of tray 134. Gas from platen gas supply system 100 is transported through the platen stem and escapes from the lower bell portion 84 onto the wafer, cooling the wafer. Similarly, the vent valve 107 is opened and gas from chamber gas supply 103 is vented into the loadlock chamber, in order to raise the loadlock pressure to one atmosphere (P=1 atm). Because the loadlock chamber volume is minimized, less gas is required to vent the chamber, and the wafer is cooled and unloaded more quickly than prior art systems.

Once the wafer has cooled, front loader 24 removes the cooled wafer from the loadlock chamber and replaces the finished wafer in the cassette module, SMIF device or FOUP.

While the particular cluster tool, as herein shown and disclosed in detail, is fully capable of obtaining the objects and providing the advantages above stated, it is to be understood that the presently preferred embodiments are merely illustrative of the invention. As such, no limitations are intended other than as defined in the appended claims.

What is claimed is:

1. A device within which a vacuum deposition process can be carried out comprising;
   a block having a top surface and a bottom surface;
   at least two loadlock chambers that extend through said block from said top surface through said bottom surface;
   a high vacuum chamber in said block in communication with each loadlock chamber;
   at least two isolation valves mounted in said block, each said valve interconnecting said high vacuum chamber with a respective loadlock chamber for selectively isolating each loadlock chamber from said high vacuum chamber; and,
   a cryoplate projecting into said high vacuum chamber and having at least two cryoplate faces positioned about directly in front of a respective isolation valve, said cryoplate face having a line-of-sight relationship with a respective loadlock chamber when said corresponding isolation valve is open.

2. The device of claim 1 further comprising at least one roughing pump attached to said block, said roughing pump being in fluid communication with said loadlock chambers.

3. The device of claim 2 further comprising a high vacuum pump mounted to said block in communication with said high vacuum chamber for selectively establishing a high vacuum in each loadlock chamber when said isolation valve corresponding to said loadlock chamber is open.

4. The device of claim 3 further comprising a refrigeration unit connected to said block, said refrigeration unit in thermal communication with said cryoplate.

5. The device of claim 4 wherein said cryoplate is located about equidistant from each isolation valve.

6. The device of claim 1 including a heat lamp assembly in thermal communication with a loadlock chamber, said heat lamp assembly comprising;

a curved reflector mounted to said block;

an upper plurality of heat lamps mounted to said reflector with an upper spacing from said loadlock chamber and being oriented for illumination into said loadlock chamber; and, a lower plurality of heat lamps with a lower spacing from said loadlock chamber and being oriented for illumination into said loadlock chamber, said upper spacing and said lower spacing being adjusted to establish a plane of uniform radiation intensity.

7. The device of claim 1 further further comprising at least one platen corresponding to each loadlock chamber, each platen extending into a respective loadlock chamber for cooling a wafer therein.

8. The device of claim 1 wherein a plurality of processing pods are located in said block, and further wherein said pods are selectively placed in fluid communication with said high vacuum chamber.

9. The device of claim 8 wherein each processing pod has a dedicated inert gas supply in fluid communication with said processing pod.

10. The device of claim 1 further comprising a tray mounted to said block and projecting into said loadlock chamber, said tray having holding means for supporting a wafer in said loadlock chamber proximate said platen.

* * * * *